United States Patent [19]
Kolem

[11] Patent Number: 5,530,352
[45] Date of Patent: Jun. 25, 1996

[54] NUCLEAR MAGNETIC RESONANCE TOMOGRAPHY APPARATUS HAVING DYNAMICALLY LOCALIZED SHIMMING OF THE BASIC MAGNETIC FIELD

[75] Inventor: Heinrich Kolem, Effeltrich, Germany

[73] Assignee: Siemens Aktiengesellschaft, Munich, Germany

[21] Appl. No.: 538,360

[22] Filed: Oct. 3, 1995

[30] Foreign Application Priority Data

Oct. 19, 1994 [DE] Germany .................. 44 37 443.7

[51] Int. Cl.⁶ .................................................. G01V 3/00
[52] U.S. Cl. .................... 324/309; 324/307; 128/653.1
[58] Field of Search .................... 324/300, 307, 324/309, 310, 311, 312, 313, 314, 318, 322; 128/653.1, 653.2

[56] References Cited

U.S. PATENT DOCUMENTS

| | | | |
|---|---|---|---|
| 4,899,109 | 2/1990 | Tropp et al. | 324/320 |
| 5,168,232 | 12/1992 | Glover et al. | 324/320 |
| 5,345,178 | 9/1994 | Manabe et al. | 324/320 |
| 5,359,289 | 10/1994 | Van Der Meulen | 324/320 |

*Primary Examiner*—Michael Tokar
*Attorney, Agent, or Firm*—Hill, Steadman & Simpson

[57] ABSTRACT

In multi-slice methods, wherein at least one further slice is excited within the repetition time for a pulse sequence for the excitation and read-out of a slice the shimming ensues dynamically dependent on the respectively measured slice. The homogeneity in the excited slice can thus be improved compared to a global shimming.

10 Claims, 3 Drawing Sheets

NUCLEAR MAGNETIC RESONANCE TOMOGRAPHY APPARATUS HAVING DYNAMICALLY LOCALIZED SHIMMING OF THE BASIC MAGNETIC FIELD

BACKGROUND OF THE INVENTION

1. Field of the Invention

The present invention is directed to a nuclear magnetic resonance tomography apparatus of the type having a basic field magnet with shim coils built into the basic field magnet, the shim coils being driven with shim currents such that a uniform magnetic field is produced in a slice of an examination volume the slice being smaller than the examination volume.

2. Description of the Prior Art

The homogeneity of the basic magnetic field is a critical factor for the quality of the image in nuclear magnetic resonance tomography apparatuses. Deviations from ideal homogeneity lead, for example, to spatial distortions.

Pulse sequences for the excitation and read-out of nuclear spins are sensitive to magnetic field inhomogeneities to different degrees. For example, relatively large magnetic field inhomogeneities can be tolerated with pure spin echo methods. In methods that are based on gradient echoes, by contrast, higher demands are made on the homogeneity. Especially high demands are made, for example, in echo planar imaging (EPI), wherein a number of nuclear magnetic resonance signals are acquired in a short time by multiple switching of a gradient after the excitation, or in turbo-gradient spin echo imaging wherein an excitation is followed by a number of 180° pulses between which a read-out gradient with alternating polarity is activated. Extremely high demands are made of the basic field homogeneity in the examination region, moreover, in functional imaging and localized spectroscopy in order to be able to adequately resolve the spectral shift.

Whereas, in the case of low demands on the magnetic field homogeneity, it suffices to shim the basic field magnet once, shimming dependent on the respective examination subject must ensue given higher demands. For example, U.S. Pat. No. 5,345,178 discloses a suitable method. Nuclear magnetic resonance signals are thereby excited and read out before each image data measurement in the examination region. Specific shim coils are provided for the shimming, with the shim current for these shim coils being calculated by evaluating the nuclear magnetic resonance signals.

In general, the homogeneity can be made better for a specific region the smaller this region is. For example, the half intensity width of a magnetic resonance line can serve as a criterion for the homogeneity. The magnetic resonance line becomes narrower the more uniform the magnetic field is.

Usually, the entire nuclear magnetic resonance signal that is received by the antenna of a nuclear magnetic resonance apparatus after a non-localized excitation is used for setting the homogeneity. Given head applications with a specific head antenna, a line width of the magnetic resonance signal of about 15 through 25 Hz is achieved with this "global" shimming. The homogeneity can, however, still vary significantly within the head.

U.S. Pat. No. 4,700,136 discloses that the homogeneity can be locally improved even further when only the signal from the region (slice or volume part) wherein the actual measurement is to occur later is used for setting the homogeneity. Thus, the magnetic field is only locally shimmed. When, for example, a volume element in the head having a size of 10×10×1 cm is shimmed, then line widths of about 8 Hz are achieved. This known method, however, is limited to one volume element, or one slice.

SUMMARY OF THE INVENTION

An object of the invention is to provide a nuclear magnetic resonance tomography apparatus and method for operating same wherein an improved homogeneity is also achieved given a measurement in a larger region.

The above object is achieved in accordance with the principles of the present invention in a nuclear magnetic resonance tomography apparatus, and in a method for operating such an apparatus, wherein nuclear spins are excited in a slice of an examination subject disposed in an examination volume and the resulting nuclear magnetic resonance signals in that slice are read out, and wherein at least one further slice is excited within the repetition time associated with the aforementioned slice, and wherein the basic magnetic field is shimmed, using shim coils which are supplied with a shim current, with the shim current being dependent on a slice which is currently being excited, in order to homogenize a volume comprising at least the currently excited slice, this volume being less than the total excitation volume.

By selecting the shim currents supplied to the shim coils so as to shim (homogenize) a volume which is less than the entire examination volume, newer imaging techniques such as, for example, echo planar imaging, turbo-gradient spin echo imaging, and chemical shift imaging can be better employed, these imaging techniques placing an especially high demand on the homogeneity of the static magnetic field. These demands are difficult to achieve over the entire examination volume (so-called "global" homogeneity), and this difficulty is alleviated by shimming a volume containing only one slice, or a group of neighboring slices, which is less than the entirety of the examination volume.

DESCRIPTION OF THE PREFERRED EMBODIMENTS

Figure 1:
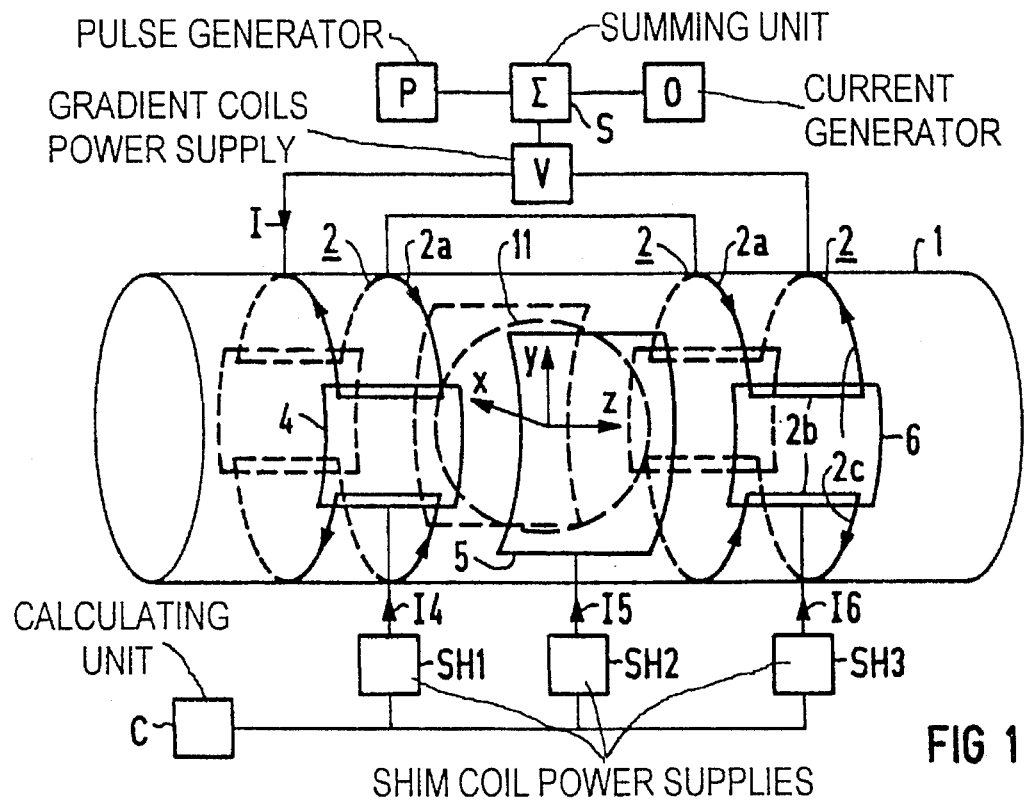
FIG. 1 illustrates an exemplary embodiment for shim coils together with x-gradients and y-gradients in accordance with the principles of the present invention.

As is known, a resolution of the nuclear magnetic resonance signals in nuclear magnetic resonance tomography ensues by means of superimposing linear magnetic field gradients on a uniform, static magnetic field. For spatial resolution in three dimensions, magnetic field gradients must be generated in three directions that preferably reside perpendicular to one another. A Cartesian coordinate system having x,y,z axes that is intended to illustrate to direction of the respective gradients, is shown in each of FIGS. 1 and 2. FIG. 1 schematically shows an arrangement of gradient coils for generating a magnetic field gradient Gy in the y-direction. (The coil structures shown in FIG. 1, and in FIG. 2 discussed below are known, but the shim coil power supplies are operated by a calculating unit in a manner in accordance with the present invention.) The gradient coils 2 are implemented as saddle coils that are secured on a carrying tube 1. A substantially constant magnetic field gradient Gy in the y-direction is generated within a spherical examination volume 11 by the conductor sections 2a. The gradient coils for the x- direction magnetic field gradient are constructed identically to the gradient coils 2 for the y-direction magnetic field gradient and are merely rotated by 90° in the azimuthal direction relative to the y-direction coils on the carrying tube 1. For clarity, they are therefore not shown in FIG. 1.

Shim coils 4 through 6 that are likewise implemented as saddle coils are also shown in FIG. 1. The shim coils 4 through 6 are merely schematically indicated; details about the design of shim coils may be found, for example, in U.S. Pat. No. 3,569,823. The respective shim coils 4 through 6 have power supplies SH1 through SH3 allocated thereto, each supplying the respective shim coil 4 through 6 with respective currents 14 through 16. The currents 14 through 16 can be controlled via a calculator unit C.

Figure 2:
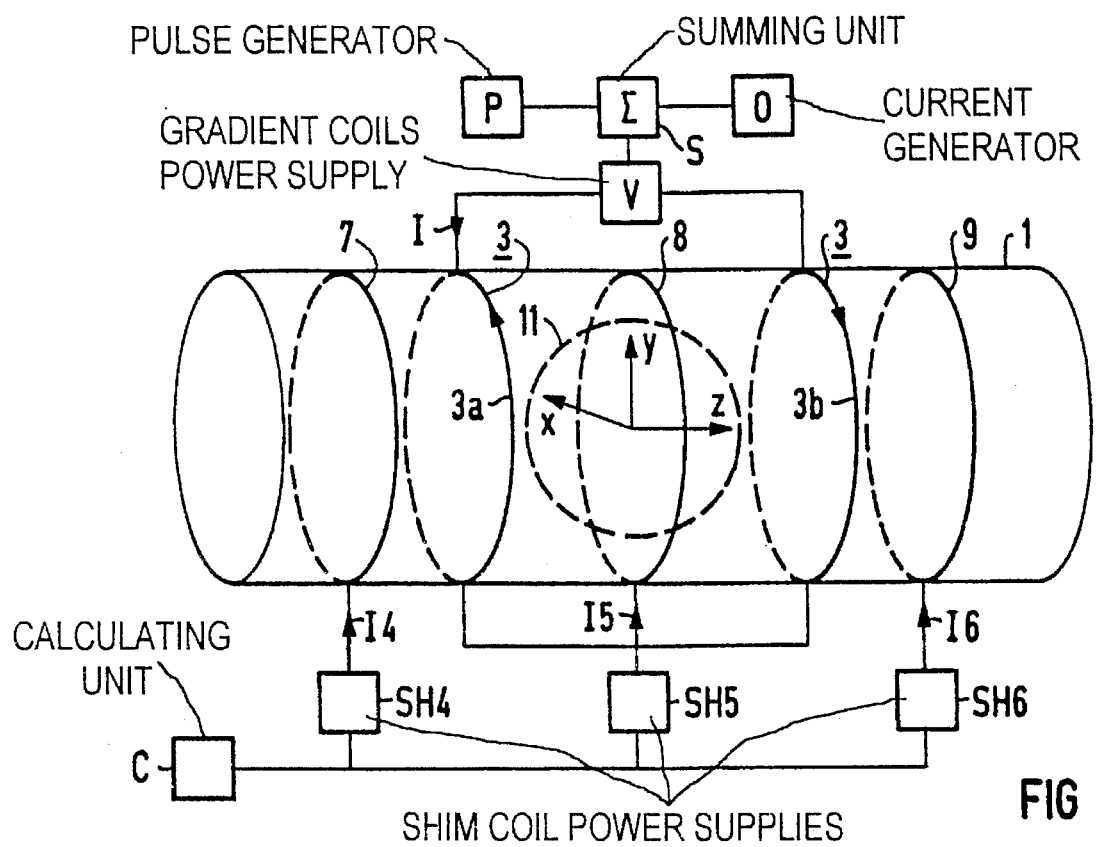
FIG. 2 illustrates an exemplary embodiment for further shim coils together with a z-gradient coil in accordance with the principles of the present invention.

The gradient coils 3 for the magnetic field gradient in the z-direction are schematically shown in FIG. 2. The coils are annularly implemented and symmetrically arranged relative to the mid-point of the examination volume 11. Since the two individual coils 3a and 3b respectively have current flowing therein in opposite directions in the way shown in FIG. 2, they cause magnetic field gradients in the z-direction. Further shim coils 7 through 9, annular shim coils in this case, are also shown in FIG. 2, again schematically, which are likewise charged with currents 14 through 16 via power supplies SH4 through SH6. The currents 14 through 16 are again controllable with the calculating unit C.

FIGS. 1 and 2 also show the power supply V for the gradient coils 2 and 3. The current I through the respective gradient coil 2 or 3 is determined by a pulse generator P that prescribes a measuring sequence. In addition to the current predetermined by the pulse control circuit P, a gradient offset current can also be determined by a current generator O whose output signal is added to the output signal of the pulse generator P.

Linear terms of the non-linear mathematical representation of the basic magnetic field can be eliminated by applying gradient offset currents. Noise terms of a higher order can also be eliminated by the additional shim coils 4 through 9, so that the homogeneity can be improved further. A method for determining inhomogeneities and for calculating the necessary gradient offset currents and shim currents disclosed in the aforementioned U.S. Pat. No. 5,345, 178. That patent, however, discloses a global shimming method wherein the homogeneity in the entire spherical examination volume 11 is to be optimized. For the optimization, the examination subject is first introduced into the examination space, the existing inhomogeneity is then measured with various pulse sequences, and the necessary shim currents, including the offset currents for gradients are determined therefrom. The currents determined in this way are then activated during the entire measurement of the examination subject.

In the course of an examination, a number of adjoining slices of the examination subject are usually excited with a chronological separation. In such "global" shimming, the shim currents remain set to a constant value for all slices.

Figure 3:
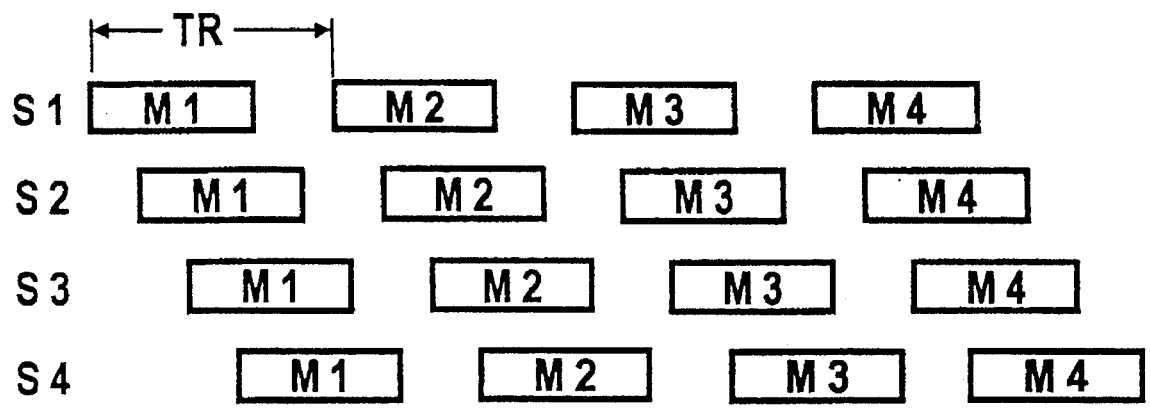
FIGS. 3–8 illustrate a pulse sequence of a type suitable as an imaging sequence in accordance with the inventive method.

When measuring a number of slices, the overall measuring time can be substantially shortened by exciting and obtaining measurements from at least one further slice during the repetition time of the measurement in a slice. It is known that after excitation of the nuclear spins in a slice and read-out of the nuclear magnetic resonance signals, one must wait until the nuclear spins are again in their quiescent (equillibrium) position predetermined by the basic magnetic field before the next measurement with the same nuclear spins can ensue. The time between two measuring events is thereby referred to as the repetition time. While waiting for the relaxation of the nuclear spins in a first slice, however, the nuclear spins in a second slice can be excited, i.e., the measurement of a second and possibly, further slices can be begun during the repetition time of the measurement of the first slice. This is referred to herein as the multi-slice method. FIG. 3 schematically shows such a multi-slice method for four slices. Measurements M1 through Mx having a repetition time TR are thereby implemented in each slice S1 through S4, whereby the measurements for the four slice overlap within the repetition time. For example, four slices can thus be measured in such a multi-slice method in about the time that would otherwise be required for the measurement of one slice.

Figure 4:
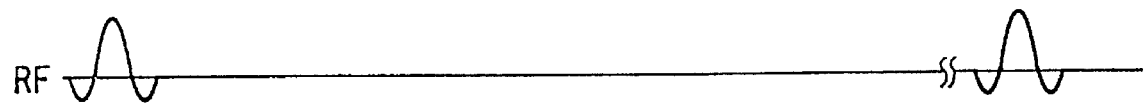
Figure 5:
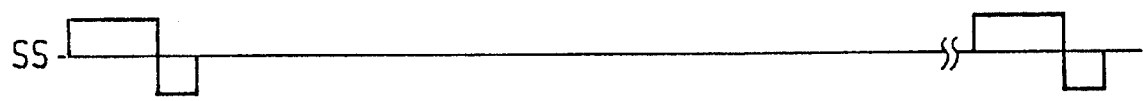
Figure 6:
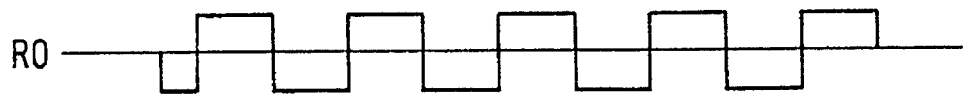
Figure 7:
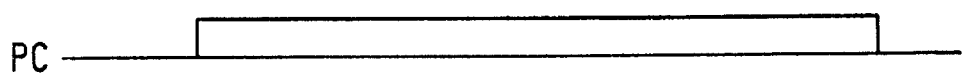
Figure 8:
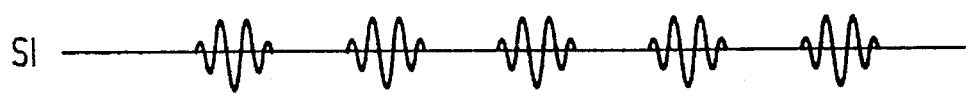

A number of pulse sequences are known for conducting such measurements themselves. Only as an example, the echo planar (EPI) method is described herein, this being especially sensitive to magnetic field inhomogeneities and the method disclosed herein for improving the homogeneity conditions of the basic magnetic field thus yields particular advantages when used in combiantion with the EPI method. Such a measuring method is schematically shown in FIGS. 4 through 8; a more detailed explanation may be found, for example, in European Application 0 076 054. In the EPI method, a radiofrequency pulse RF according to FIG. 4 is emitted in the presence of a slice selection gradient SS according to FIG. 5. The dephasing caused by the slice selection gradient SS is subsequently rephased by a negative pulse part. The nuclear spins are rephased each time by multiple inversion of a read-out gradient RO according to FIG. 6, so that nuclear magnetic resonance signals SI as shown in FIG. 8 arise. During the read-out phase, a phase-coding gradient PC according to FIG. 7 is simultaneously activated, the nuclear magnetic resonance signals that are read out being differently phase-coded thereby. An image of the excited slice or slices of the subject is then constructed from the read-out signals in a known manner.

Before a new excitation ensues in the EPI method, one must wait a for a time during which the nuclear spins can relax before a new excitation ensues. The spacing between two excitations is referred to as the repetition time TR. The measurements for a number of slices can be interleaved as shown in FIG. 3.

Figure 9:
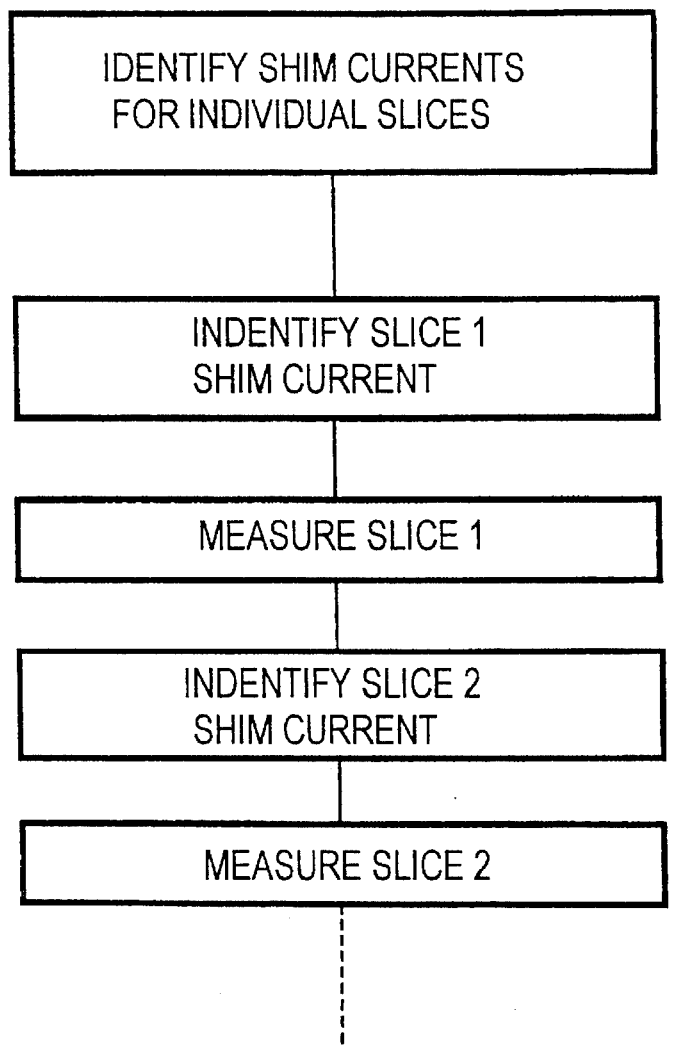
FIG. 9 is a flowchart for the multi-slice technique of the invention.

In accordance with the present invention, the shimming does not remain constant when changing from slice to slice, but instead is dynamically set for each slice. This is schematically shown in a flowchart in FIG. 9. First, the optimum shim or offset currents are identified individually for each slice. This can ensue, for example, according to the method disclosed by U.S. Pat. No. 5,345,178. The optimum shim currents/offset currents are stored in a memory (which may be a part of the calculating unit C) for the individual slices. Before the measurements are respectively sequentially obtained in the individual slices S1 through S4, the optimum shim currents/offset currents are respectively dynamically set individually or in common for a selected number of neighboring slices as a group (the slices constituting the group, however, occupying less than the complete examination volume 11 ). Given simpler demands, only the linear inhomogeneity terms need be corrected for which it is sufficient for the gradient offset currents respectively matching the slices S1 through S4 to be superimposed on the already dynamically activated gradients. Given higher demands, the optimum shim currents for the shim coils are additionally dynamically set from slice to slice.

Significantly better homogeneity values, given an existing basic field inhomogeneity, can be achieved within the respectively measured slice using the disclosed method. This is especially of interest because new techniques such as, for example, echo planar imaging, turbo-gradient spin echo imaging and chemical shift imaging demand an especially high homogeneity, but high demands made of global homogeneity values are disadvantageous. These high demands, namely, can only be satisfied by using relatively long magnets that, however, are expensive and uncomfortable for patients because of claustrophobic phenomena.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for operating a magnetic resonance imaging tomography apparatus comprising the steps of:

generating a static magnetic field having a homogeneity associated therewith in an examination volume;

generating at least one gradient magnetic field superimposed on said static magnetic field in said examination volume;

exciting nuclear spins in a slice, defined by said at least one gradient magnetic field, of an examination subject disposed in said examination volume and thereby producing nuclear magnetic resonance signals in said subject;

reading out said nuclear magnetic resonance signals in said slice, the excitation and read out of said slice having a repetition time associated therewith;

exciting nuclear spins in at least one further slice of said examination subject in said examination volume within said repetition time; and shimming said static magnetic field with a plurality of shim coils by supplying currents to said shim coils dependent on a currently excited slice for homogenizing a volume comprising at least one slice of said examination subject, said volume being less than said examination volume.

2. A method as claimed in claim 1 wherein the step of shimming said static magnetic field comprises shimming said static magnetic field by supplying currents to said plurality of shim coils dependent on a currently excited slice for homogenizing a volume comprising a group of neighboring slices of said examination subject, said volume being less than said examination volume.

3. A method as claimed in claim 1 comprising the additional steps of:

measuring and storing a plurality of shim currents for said shim coils for said group of slices before reading out said nuclear magnetic resonance signals, and supplying said stored currents to said shim coils during the excitation and read out of said slice.

4. A method as claimed in claim I comprising the additional steps of measuring and storing shim currents for said shim coils for each slice of said examination subject which is to be excited, before reading out said nuclear magnetic resonance signals, and supplying the stored shim currents to said shim coils during the excitation and read out of each slice.

5. A method as claimed in claim 1 wherein said at least one gradient magnetic field is generated by a plurality of gradient coils, and comprising the additional step of using said gradient coils as said shim coils by applying offset currents to said gradient coils dependent on a currently excited slice for homogenizing said volume comprising at least one slice.

6. A magnetic resonance imaging tomography comprising:

means for generating a static magnetic field having a homogeneity associated therewith in an examination volume;

means for generating at least one gradient magnetic field superimposed on said static magnetic field in said examination volume;

means for exciting nuclear spins in a slice, defined by said at least one gradient magnetic field, of an examination subject disposed in said examination volume and thereby producing nuclear magnetic resonance signals in said subject;

means for reading out said nuclear magnetic resonance signals in said slice, the excitation and read out of said slice having a repetition time associated therewith;

said means for exciting comprising means for exciting nuclear spins in at least one further slice of said examination subject in said examination volume within said repetition time;

a plurality of shim coils; and means for supplying currents to said shim coils dependent on a currently excited slice for shimming said static magnetic field for homogenizing a volume comprising at least one slice of said examination subject, said volume being less than said examination volume.

7. An apparatus as claimed in claim 6 wherein said means for supplying currents to said shim coils comprise means supplying currents to said plurality of shim coils dependent on a currently excited slice for homogenizing a volume comprising a group of neighboring slices of said examination subject, said volume being less than said examination volume.

8. An apparatus as claimed in claim 6 further comprising:

means for measuring and storing a plurality of shim currents for said shim coils for said group of slices before reading out said nuclear magnetic resonance signals, and for supplying said stored currents to said shim coils during the excitation and read out of said slice.

9. An apparatus as claimed in claim 6 further comprising means for measuring and storing shim currents for said shim coils for each slice of said examination subject which is to be excited, before reading out said nuclear magnetic resonance signals, and for supplying the stored shim currents to said shim coils during the excitation and read out of each slice.

10. An apparatus as claimed in claim 6 wherein said means for generating at least one gradient magnetic field comprises a plurality of gradient coils, and wherein said gradient coils comprise said shim coils.

\* \* \* \* \*